United States Patent [19]

Küyel

[11] 4,333,814
[45] Jun. 8, 1982

[54] METHODS AND APPARATUS FOR IMPROVING AN RF EXCITED REACTIVE GAS PLASMA

[75] Inventor: Birol Küyel, Hopewell, N.J.

[73] Assignee: Western Electric Company, Inc., New York, N.Y.

[21] Appl. No.: 107,223

[22] Filed: Dec. 26, 1979

[51] Int. Cl.³ .............................................. C23F 1/02
[52] U.S. Cl. .................................. 204/298; 156/345; 156/643; 204/192 E; 422/186.29; 422/906
[58] Field of Search ................ 204/192 R, 192 E, 298, 204/164; 156/643, 646, 345; 118/620, 623, 625, 715; 427/38, 39, 47; 250/527–531

[56] References Cited

U.S. PATENT DOCUMENTS

| | | | |
|---|---|---|---|
| 3,730,873 | 5/1973 | Pompei et al. | 204/298 |
| 3,767,551 | 10/1973 | Lang, Jr. et al. | 204/192 |
| 3,864,239 | 2/1975 | Fletcher et al. | 204/298 |
| 4,222,838 | 9/1980 | Bhagat et al. | 204/192 E |
| 4,233,109 | 11/1980 | Nishizawa | 156/643 |

OTHER PUBLICATIONS

J. S. Logan, Control of RF Sputtered Properties Through Substrate Tuning, *IBM J. Res. Develop.*, Mar. 1970, pp. 172–175.
J. L. Vossen et al., *Thin Film Processes*, Academic Press, New York, 1978, pp. 50–58.
L. I. Maissel et al., *Handbook of Thin Film Technology*, McGraw-Hill, New York, 1970, pp. 3-9 to 3-11.

*Primary Examiner*—Delbert E. Gantz
*Assistant Examiner*—William Leader
*Attorney, Agent, or Firm*—A. M. Tobia

[57] ABSTRACT

The quality of a plasma etching process is improved by applying a DC potential (28′) to one of the energizing electrodes (12′) in the reaction chamber (11′). The DC potential withdraws a small current from the plasma which causes the reaction to produce a uniform, controllable self-bias on the workpiece placed on the opposite (or second) electrode.

2 Claims, 7 Drawing Figures

METHODS AND APPARATUS FOR IMPROVING AN RF EXCITED REACTIVE GAS PLASMA

FIELD OF THE INVNENTION

Broadly speaking, this invention relates to reactive gas plasmas. More particularly, in a preferred embodiment, this invention relates to methods and apparatus for improving the physical and chemical properties of an RF-excited, reactive gas plasma process, and specifically to methods and apparatus for improving the uniformity and repeatability of the reaction that occurs on at least one surface of a workpiece exposed to the RF plasma.

BACKGROUND OF THE INVENTION

In the manufacture of integrated circuits, and the like, it is often necessary to etch portions of a silicon wafer, for example, through the windows of an overlaying, patterned mask manufactured from some suitable resist material. Alternatively, it may be necessary to etch a thick layer of polysilicon and to terminate the etch when an underlaying thin layer of $SiO_2$ is reached. This latter technique requires an etch process that will selectively etch polysilicon but which is inert to $SiO_2$.

In both of the above cases, it is customary to employ a wet chemical etch; however, considerable interest has been expressed recently in the use of reactive gas plasmas to perform the etching. The reason for this is that reactive gas plasmas have been found to be anisotropic under some circumstances and, in general, are cleaner, more efficient and far less troublesome to use than wet chemical etches.

A plasma etch is typically carried out in an evacuated reaction chamber, for example, the reaction chamber disclosed by Reinberg in U.S. Pat. No. 3,757,733, which issued Sept. 11, 1973, which patent is hereby incorporated by reference as if more fully set forth herein.

As might be expected, the potential of the wafer surface, with respect to the plasma, has been found to play an important role in an RF plasma etching process. Unfortunately, heretofore, no satisfactory way has been found to establish this potential independently of the other operating parameters in the reaction chamber. Furthermore, the self-bias that is induced on the surface of the wafer by the plasma itself has been found to be very sensitive to almost all of the parameters of the etching process, including the system geometry. As a result of the above, prior art plasma etching processes have been plagued with irreproducibility and unpredictability, resulting in very low yield. Some attempts to correct this problem have been made, for example, by placing a DC bias on the electrode that carries the wafer, or by grounding the electrode through either a resistive or a capacitive impedance. Unfortunately, such attempts have not been successful for the simple reason that the potential of the electrode is not necessarily the same as the potential of the surface of a wafer supported by the electrode. This is especially true if the wafer to be etched includes a dielectric, interlevel layer, for example, a thin film of $SiO_2$.

SUMMARY OF THE INVENTION

As a solution to these and other problems, I propose an RF plasma etching process wherein a small current is withdrawn from the plasma during the etching process. This current withdrawal scatters oppositely charged particles onto the surface of the wafer, charging the surface of the wafer, as desired. The amount of charge can be varied by altering the amount of current withdrawn from the plasma. The process according to the invention puts the potential where it is needed—on the surface of the wafer—rather than on the support electrode.

The invention and its mode of operation will be more fully understood from the following detailed description, when taken with the appended drawings in which:

DETAILED DESCRIPTION

Figure 1:
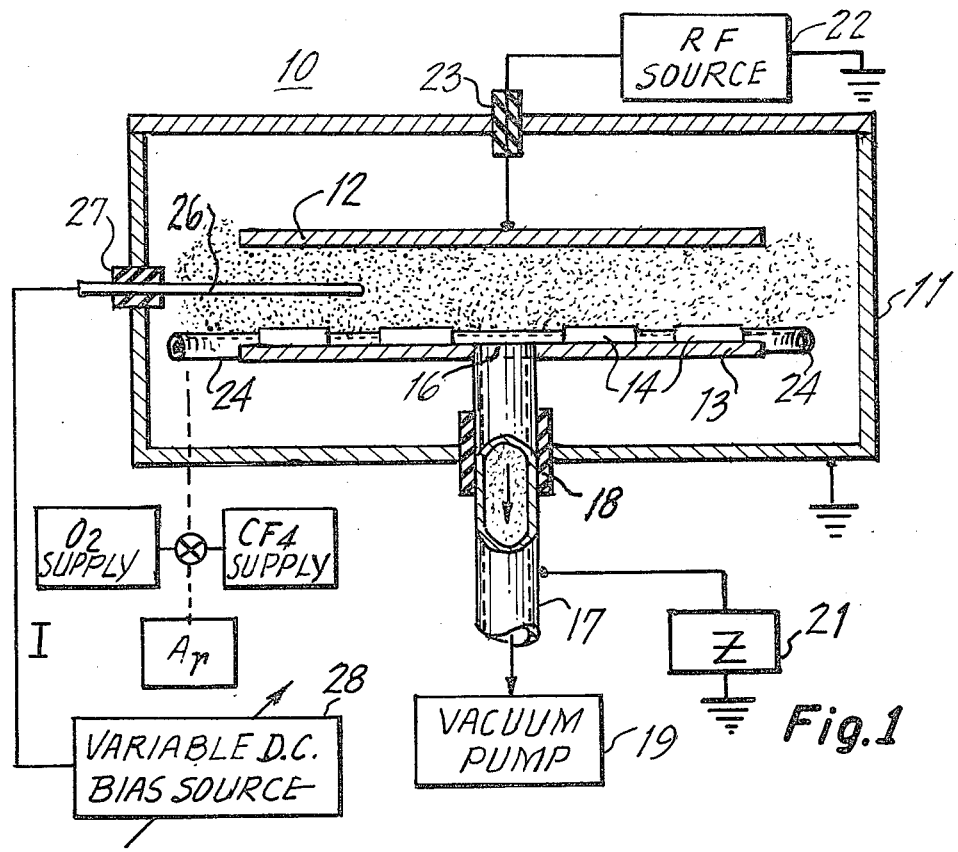
FIG. 1 is a cross-sectional view of an illustrative reaction chamber including a current probe according to the invention.

FIG. 1 depicts a first illustrative embodiment of the invention and a typical operating environment therefor. It must be emphasized from the outset that while the preferred embodiment of the invention, to be discussed in detail below, pertains to plasma etching, the invention may also be used in plasma deposition processes, with equal success. More specifically, when the invention is applied to a plasma deposition process, the surface stress, the index of refraction and the porosity of the deposited layer are all improved. It should also be emphasized that the invention is not restricted to use with silicon workpieces; indeed, any workpiece that is affected by a reactive gas plasma is encompassed by the claims of this invention.

Turning our attention back to plasma etching, FIG. 1 depicts a Reinberg-type reaction chamber 10 comprising a hollow, cylindrical member 11 constructed, for example, of aluminum, and having a pair of cylindrical, spaced-apart, disc-shaped electrodes 12 and 13 positioned therein. The upper surface of lower electrode 13 supports a plurality of workpieces 14. Although not shown in the drawing, one skilled in the art will appreciate that a corresponding plurality of workpieces could be affixed to the lower surface of upper electrode 12 if it is desired to increase throughput. Electrode 13 has a central aperture 16 formed therein and is connected to a hollow, metal pipe 17 which is insulated from member 11 by means of an insulated, hermetic bushing 18. The lower end of pipe 17 is connected to a vacuum pump 19 which serves to maintain the vacuum within the reaction chamber and also to remove spent gases from the chamber. Pipe 17 is connected to ground via a resistive or capacitive impedance 21.

To test the bias produced on a floating electrode by drawing current from the probe, the output of a radio frequency source 22, illustratively operating at 13.5 MHz, is connected to upper electrode 12 through the walls of member 11 by means of an insulated, hermetic bushing 23. The gas which is to form the plasma, e.g., the inert gas Ar, is connected to a foraminous, toroidal pipe 24 which is positioned within member 11, coaxial with electrode 13 and proximate the edges thereof. A probe 26 passes through the wall of member 11 by means of an insulating bushing 27 and extends into the region of space where the plasma will exist when the gas supply is turned on and RF-source 22 activated. The other end of probe 26 connects to a variable DC bias source 28. In operation, and when the plasma is activated, this permits the operator to alter the amount of current that is withdrawn from the plasma by means of probe 26.

Figure 2:
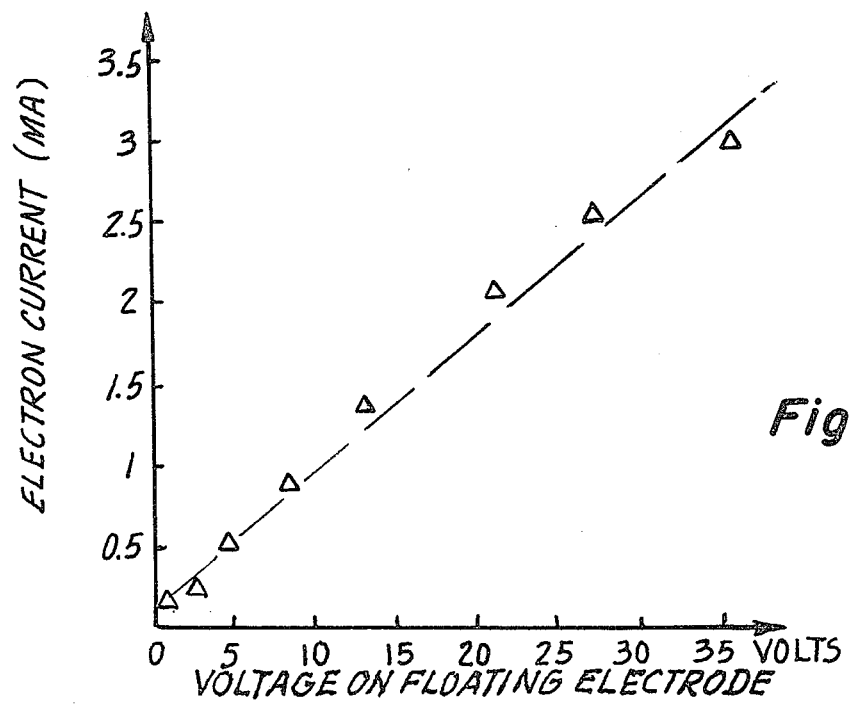
FIG. 2 is a graph showing the manner in which the voltage developed across a "floating" electrode in the reaction chamber shown in FIG. 1 varies as a function of the current withdrawn from the plasma.

FIG. 2 is a graph which illustrates the results of an experiment which was performed using the apparatus shown in FIG. 1. The plasma employed for this experiment was an Ar plasma and lower electrode 13 was connected to ground via a high impedance so that, in effect, the electrode 13 was "floating." As may be seen from the graph, there is almost a linear relationship between the current withdrawn from the plasma by the probe and the potential that is established on the electrode 13. Since the plasma potential was constant during the experiment, the potential between the electrode 13 and the plasma varied in a similar linear fashion. There does not yet exist a rigorous physical explanation for the observed phenomena; however, it is known that the electrical conditions in the vicinity of the probe must satisfy Kirchoff's Law. Thus, the electron current withdrawn from the probe must be exactly matched by an ion current which is injected into the plasma.

Now, from a DC standpoint, the upper electrode is grounded. Therefore, if we were dealing with a simple circuit, current would flow from the zero impedance path and we would be unable to establish a DC potential on the floating electrode. But, as shown in FIG. 2, we do establish a DC potential on the floating electrode. The most likely explanation for this totally unexpected result is that the trajectory of the ions leaving the probe depends on the boundary conditions of the probe itself and not on the boundary conditions established by the electrodes. Thus, by an appropriate choice of probe location, the ions injected by the probe will almost all end up on the electrodes (or on the workpieces supported by the electrodes) and not lost in the plasma, resulting in a controllable, self-bias on the electrodes.

One should not be lead into a false comparison between the instant invention and other known devices, for example, the vacuum triode. Probe 26 is not a control grid. Further, as is well known triodes work by retarding electrons—a potential effect—but no such mechanism is present in the instant invention. The experiments that were conducted, and the graph shown in FIG. 2, clearly establish that the effect which is observed in the instant invention is a current effect. As proof of this, it was observed that by use of two different probes, with differing potentials but the same probe current, the same self-bias is achieved, which would not be the case with a triode device.

Let us now consider the workpieces themselves and, in particular, a series of experiments that was conducted on a workpiece comprising a silicon wafer having, in order, a relatively thin layer of dielectric $SiO_2$, a relatively thick layer of polysilicon and an overlaying layer of photoresist.

Figure 3:
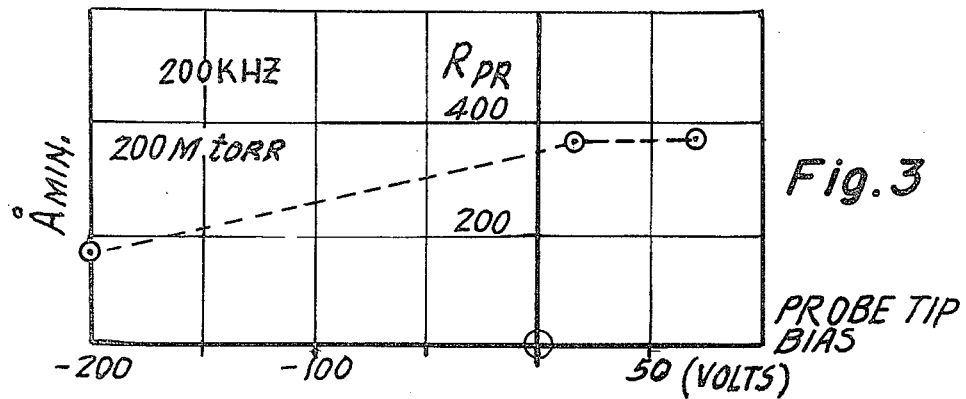
FIG. 3 is a graph showing $R_{PR}$, the rate at which a photoresist is etched, as a function of the potential applied to the probe.
Figure 4:
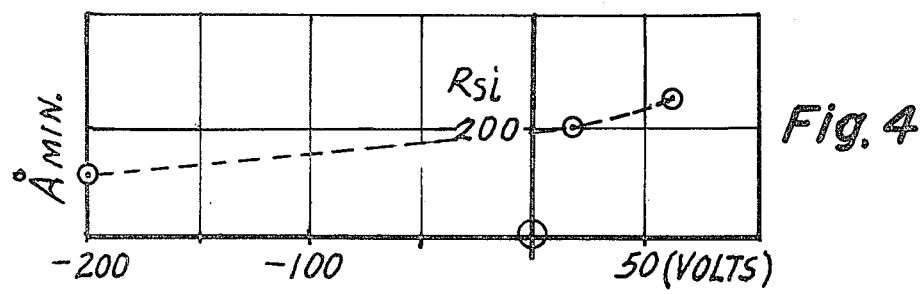
FIG. 4 is a graph showing $R_{Si}$, the rate at which polysilicon is etched, as a function of the potential applied to the probe.
Figure 5:
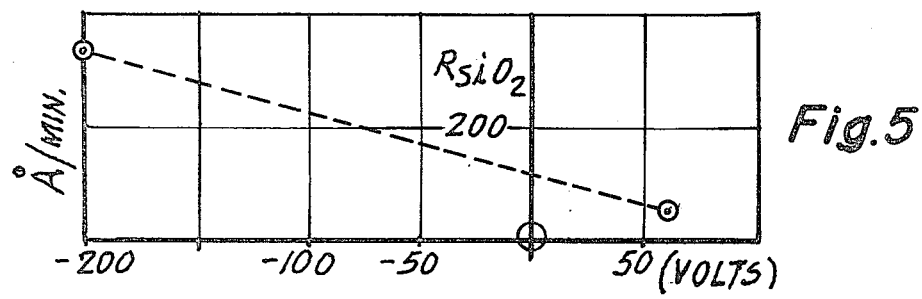
FIG. 5 is a graph showing $R_{SiO}$, the etch rate for $SiO_2$, as a function of the voltage applied to the probe.
Figure 6:
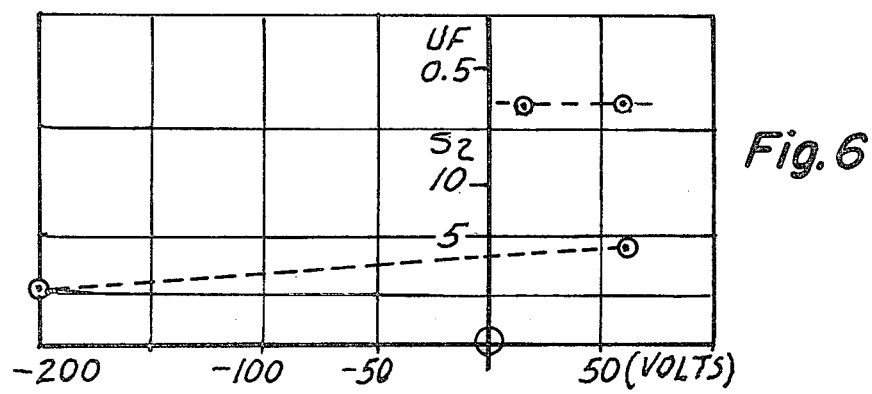
FIG. 6 is a graph showing both the undercut factor UF and the selective etch rate $S_2$ for silicon and $SiO_2$, as a function of the potential applied to the probe.

FIG. 3 is a graph which depicts $R_{PR}$, the etch rate in angstroms per minute of a typical photoresist in a plasma which was excited at a frequency of 200 KHz and at a pressure of 200 millitorr, as a function of the potential on the probe using a $CF_4$ and $O_2$ gas plasma. FIG. 4 similarly shows $R_{Si}$, the etch rate for polysilicon under similar conditions, while FIG. 5 shows $R_{SiO_2}$, the etch rate for $SiO_2$. FIG. 6, on the other hand, is a graph showing the selectivity of the process, that is, the ratio of the etch rate of silicon to the etch rate of $SiO_2$, as a function of the potential applied to the probe. The same graph also shows the undercutting factor UF.

For practical considerations, in the experiments to be described it was the probe voltage, rather than the voltage on the wafer surface, that was actually monitored. However, since the current withdrawn by the probe is a unique function of the probe voltage and, as shown in FIG. 2, since the potential on a "floating" surface in contact with the plasma is a linear function of the probe current, the DC voltage on the wafer can be assumed to be a function of the probe voltage.

Thus, FIGS. 3 through 6 clearly demonstrate that not only do the various etch rates change with the voltage established on the surface of the wafer but also the relative etch rate, implying the existance of two chemical processes, one driven by neutral species and the other driven by charged species.

Now, in a successful plasma etch process, we want the etch rate of the photoresist to be low, the etch rate of the polysilicon to be relatively high and the etch rate of the dielectric $SiO_2$ to be relatively low. FIG. 3 shows that as the potential on the probe is increased, the etch rate of the photoresist increases. Of course, it would be better if the etch rate of the photoresist were to decrease however, even at a probe potential of $+60$ volts it will be seen that the etch rate of the photoresist is no higher than it would be at $+5$ volts, say. Thus, the instant invention leaves the etch rate of the photoresist essentially where it is with prior art plasma etching processes and we have neither lost nor gained ground with respect to the etching of the photoresist. However, FIG. 4 demonstrates that the etch rate of the polysilicon increases slightly with increasing probe bias, which is desirable. FIG. 5 however, is the most dramatic graph and clearly shows a significant decline in the etch rate of the dielectric $SiO_2$ with increasing probe bias, which is of great commercial significance. As shown in FIG. 6, the selectivity of the process $S_2$, defined as the ratio of $R_{Si}/R_{SiO_2}$, increases with increasing probe bias; thus, the instant invention dramatically improves over the prior art. FIG. 6 also shows that the undercut factor is neither increased or decreased by the instant invention, which is also of commercial significance.

These graphs shown in FIGS. 3–6 clearly demonstrate the role of the energy of the charged species in plasma etching. Furthermore, the noted parabolic variation of the etch rates over the surface of the workpiece directly demonstrates the importance of the ion trajectories and the flux. This variation further confirms our understanding of the role of the probe as a charge scatterer.

The arrangement shown in FIG. 1 is not the optimum arrangement for actual industrial application because the probe tends to disturb the spatial uniformity within the reaction chamber and the ion trajectories are then not uniform over the wafers.

Figure 7:
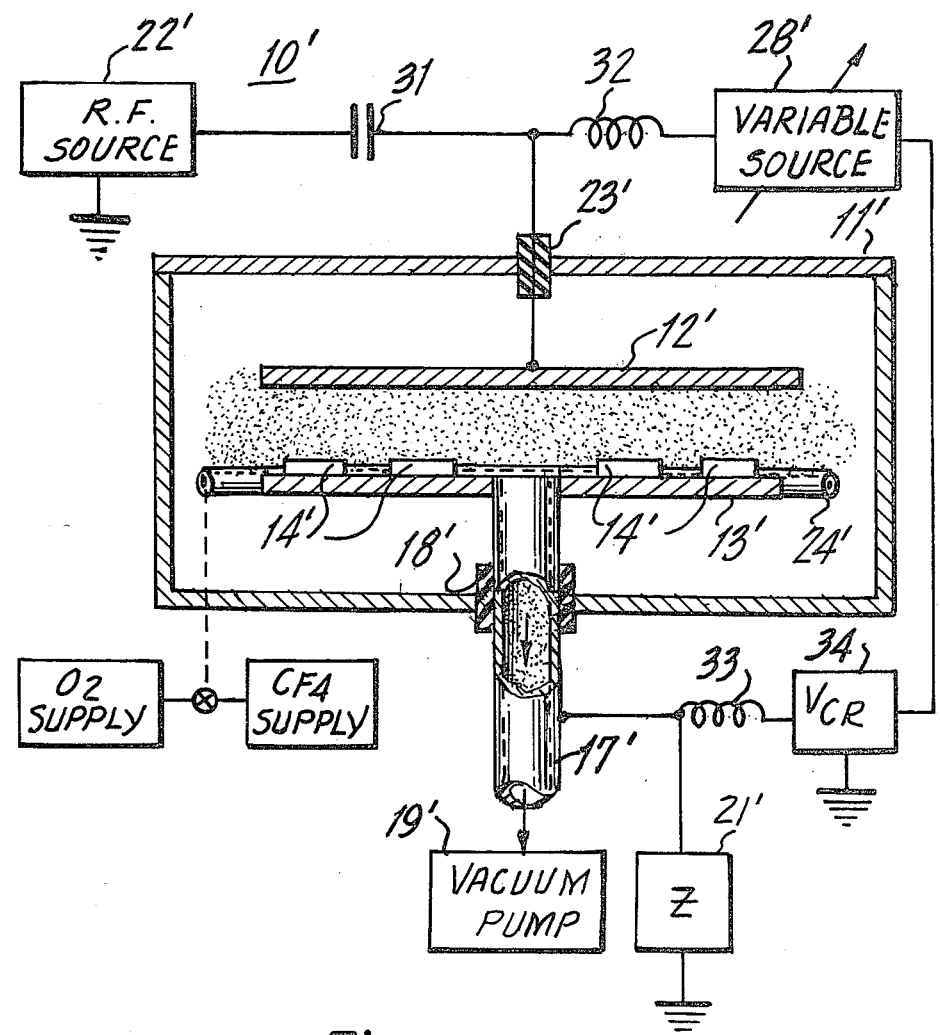
FIG. 7 is a cross-sectional view of a second illustrative embodiment of the invention.

FIG. 7 depicts an alternate embodiment of the invention which achieves the same results without the use of a probe. As shown, reaction chamber 10' is essentially identical to reaction chamber 10 shown in FIG. 1 except that in FIG. 7 the energy from RF-source 22' is applied to electrode 12' through a coupling capacitor 31, rather than directly. In this embodiment, variable DC voltage source 28" is not, however, connected to a probe but, rather, to the upper electrode 12', via an RF-choke 32. A feedback circuit is also incorporated to maintain the DC current withdrawn from the plasma by source 28' at a substantially constant level. This feedback circuit comprises a voltage-controlled-resistor 34 which is coupled to the lower electrode 13', via a second RF-choke 33.

In operation, $O_2$ and $CF_4$ gases are supplied to the chamber, via foraminous, toroidal pipe 24' and RF-source 22' energized to create a reactive plasma within the chamber. At the same time, variable DC source 28' withdraws a fixed DC current from the plasma, via upper electrode 12'. RF-choke 32 ensures that no RF current can enter DC source 28' or the feedback circuit while, at the same time, coupling capacitor 31 ensures that no DC signal is fed back into RF-source 22'.

The DC potential which is developed on electrode 13' (which is not necessarily the same as that which is developed on the surface of the workpieces) is fed, via RF-choke 33, to the voltage-controlled-resistor 34 and, if for any reason there should be a tendency for the current withdrawn from the plasma to increase or decrease, the VCR adjusts itself, in an offsetting manner, to maintain the current withdrawn from electrode 12' at a constant level.

One skilled in the art may make various changes and substitutions to the layout of part shown, without departing from the spirit and scope of the invention.

What is claimed is:

1. Apparatus for controlling the plasma etching of at least one surface of a workpiece which comprises:
   a hermetically-sealed reaction chamber;
   first and second, spaced-apart, electrodes positioned within said chamber, said workpiece being supported by at least said second electrode for exposure to the plasma;
   means for supplying at least one gas species to said reaction chamber;
   means for maintaining a predetermined level of vacuum within said chamber, said means also serving to exhaust spend gases and reaction by-products from the chamber;
   a source of RF energy for establishing an alternating field between said first and second electrodes thereby to excite said gas species to form an RF reactive gas plasma;
   a DC blocking capacitor intermediate the output of said source of RF energy and said first electrode;
   a variable source of DC potential;
   an RF-choke interconnecting a first output terminal of said variable source of DC potential and said first electrode;
   a voltage-controlled-resistor having a control electrode connected intermediate a second output terminal of said variable DC source and ground; and
   an RF-choke interconnecting the control electrode of said voltage-controlled-resistor and said second electrode.

2. The apparatus according to claim 1 wherein said second electrode is connected to ground through an impedance which is substantially greater than the impedance of either said alternating field establishing means or said variable DC source.

* * * * *

UNITED STATES PATENT AND TRADEMARK OFFICE
CERTIFICATE OF CORRECTION

PATENT NO. : 4,333,814
DATED : June 8, 1982
INVENTOR(S) : B. Kuyel

It is certified that error appears in the above—identified patent and that said Letters Patent is hereby corrected as shown below:

On the title page, under the section entitled "References Cited," the following references should be listed:

| | | | |
|---|---|---|---|
| 3,528,387 | 9/1970 | Hamilton | 118/49.1 |
| 3,664,942 | 5/1972 | Havas et al. | 204/192 |
| 4,085,022 | 4/1978 | Wechsung et al. | 204/192-E |

"Providing Individual Etchstops for Wafers in Reactive Ion Etching" by L. M. Ephrath, IBM Technical Disclosure Bulletin, Vol. 20, No. 11A, April, 1978, pp. 4637-4638.

"Ion Etch Technique for Fabrication of Ultrathin Films" by R. B. Laibowitz and R. T. C. Tsui, IBM Technical Disclosure Bulletin, Vol. 10, No. 10, March, 1968, pg. 1474.

The reference which reads "J. S. Logan, Control of RF Sputtered Properties" should read --J. S. Logan, Control of RF Sputtered Film Properties--.

Column 2, line 26, "$R_{SiO}$" should read --$R_{SiO_2}$--.

Column 3, line 42, "do" should read --do--; line 46, "not" should read --not--; line 54, "not" should read --not--

UNITED STATES PATENT AND TRADEMARK OFFICE
CERTIFICATE OF CORRECTION

PATENT NO. : 4,333,814
DATED : June 8, 1982
INVENTOR(S) : B. Kuyel

It is certified that error appears in the above–identified patent and that said Letters Patent are hereby corrected as shown below:

Column 6, claim 1, line 13, "spend" should read --spent--.

Signed and Sealed this

Twenty-fourth Day of January 1984

[SEAL]

Attest:

GERALD J. MOSSINGHOFF

Attesting Officer          Commissioner of Patents and Trademarks